United States Patent [19]

Ferla et al.

[11] Patent Number: 5,141,883
[45] Date of Patent: Aug. 25, 1992

[54] PROCESS FOR THE MANUFACTURE OF POWER-MOS SEMICONDUCTOR DEVICES

[75] Inventors: Giuseppe Ferla; Carmelo Magro, both of Catania Ct; Paolo Lanza, Cassaro Sr, Italy

[73] Assignee: SGS-Thomson Microelectronics S.r.L., Agrate Brianza, Italy

[21] Appl. No.: 632,485

[22] Filed: Dec. 24, 1990

[30] Foreign Application Priority Data

Dec. 29, 1989 [IT] Italy ............... 22891 A/89

[51] Int. Cl.⁵ .................................. H01L 21/265
[52] U.S. Cl. ......................... 437/40; 437/29; 437/41; 148/DIG. 126
[58] Field of Search ............ 437/40, 27, 29, 147, 437/148, 149, 150, 41; 148/DIG. 126; 357/23.4

[56] References Cited

U.S. PATENT DOCUMENTS

| | | | |
|---|---|---|---|
| 4,489,481 | 12/1984 | Jones | 437/228 |
| 4,677,735 | 7/1987 | Malhi | 437/200 |
| 4,716,126 | 12/1987 | Cogan | 437/29 |
| 4,735,680 | 4/1988 | Yen | 437/228 |
| 4,757,032 | 7/1988 | Contiero | 437/160 |
| 4,772,569 | 9/1988 | Ishii et al. | 437/228 |
| 4,774,198 | 9/1988 | Contiero et al. | 437/29 |
| 4,798,810 | 1/1989 | Blanchard et al. | 437/154 |
| 4,842,675 | 6/1989 | Chapman et al. | 437/228 |
| 4,902,636 | 2/1990 | Akiyama et al. | 437/40 |
| 4,949,136 | 8/1990 | Juin | 357/23.4 |
| 4,985,740 | 1/1991 | Shenai et al. | 357/23.4 |

FOREIGN PATENT DOCUMENTS

| | | |
|---|---|---|
| 0097866 | 1/1984 | . |
| 0229362 | 7/1987 | European Pat. Off. . |
| 0251506 | 1/1988 | European Pat. Off. . |

OTHER PUBLICATIONS

"The Application of Ion Beam Mixing, Doped Silicide, and Rapid Thermal Processing to Self-Aligned Silicide Technology", J. Electrochem. Soc., vol. 137, No. 2, Feb. 1990, pp. 728-740.

"Optimized Silicon Low-Voltage Power MOSFET's for High Frequency Power Conversion" Krishna Shenai, et al. IEEE 1989, pp. 180-189.

"High-Performance Vertical-Power DMOSFET's With Selectively Silicided Gate and Source Regions", Krishna Shenai et al., IEEE Electron Device Letters, Apr. 10, 1989, No. 4, New York, pp. 153-155.

"Experimental Technology and Characterization of Self-Aligned . . . ", G. A. Sai-Halasz et al., International Electronic Devices Meeting, Dec. 6-9, 1987, Washington, D.C., pp. 397-400.

Primary Examiner—Brian E. Hearn
Assistant Examiner—Michael Trinh
Attorney, Agent, or Firm—Wenderoth, Lind & Ponack

[57] ABSTRACT

A process for the manufacture of power-MOS semiconductor devices achieves high cell density by the use of self-aligning techniques and photographic exposure equipment of the stepper type. The process calls for definition and formation of the source by a complementary spacer technique and metallization of the source and gate contact areas by silicides after formation of spacers on the gate wall.

10 Claims, 2 Drawing Sheets

PROCESS FOR THE MANUFACTURE OF POWER-MOS SEMICONDUCTOR DEVICES

BACKGROUND OF THE INVENTION

1. Field of the Invention

The present invention relates to a process for the manufacture of power-MOS semiconductor devices with high density of the elementary MOS cells.

2. Description of the Prior Art

In the manufacture of power-MOS devices there are commonly used techniques aimed at the embodiment of high cell density typical of Large Scale Integration (LSI) technology which allow the integration of numerous cells of the device and structures with ever smaller characteristic dimensions, i.e. with smaller silicon areas, or with better performances for a given silicon area used. The present density of power-MOS devices is on the order of 2-3 million elementary cells per square inch, to which corresponds for the elementary cell a typical "Xpitch" dimension of approximately 17 $\mu$m where Xpitch stands for (see FIG. 1) the sum of the side dimension Xd (approximately 7 $\mu$m) of the gate electrode, and of the dimension Xc (approximately 10 $\mu$m) of the opening in the polycrystalline silicon layer.

The minimum dimensions of the cell obtained in accordance with conventional processes are conditioned by the resolving power and the alignment limits of the photographic exposure system used, as well as the tolerances imposed by the various steps of the production process. More precisely, the minimal dimensions Xc are determined by the requirement to effect three successive alignments inside the polycrystalline silicon, and by the technological limit associated with the smallest possible openings. Using conventional photographic exposure equipment with projection the minimal dimensions of Xc are approximately 8 $\mu$m.

The smallest side dimensions of the gate (Xd) are linked to the requirement of allowing sufficiently deep diffusion of the body dopant to prevent the formation of short circuits due to the so-called spikes of aluminum which occur in conventional metallizations. Said minimal dimensions of Xd are approximately 6-7 $\mu$m regardless of the technique used.

SUMMARY OF THE INVENTION

The object of the present invention is to considerably reduce the minimal dimensions of the elementary cells (Xpitch) of a power-MOS device so as to increase the density of integration of the corresponding devices and at the same time simplify the manufacturing process.

The process for manufacture of power-MOS semiconductor devices in accordance with the present invention comprises the following steps:

epitaxial growth on a silicon substrate having a certain conductivity type of at least one layer of silicon of the same conductivity type;
gate oxidation over the entire substrate;
deposition of a layer of polycrystalline silicon on a face of the substrate;
opening by photoengraving of a gate window in the layer of polycrystalline silicon for definition of the gate polysilicon;
implantation and diffusion of a dopant into the aforesaid gate window for formation of the body;
implantation and diffusion of a dopant in the body for formation of the source regions;
deposition of P-Vapox dielectric on the face of the substrate;
opening of windows on the face of the substrate for formation of the source contacts, and
deposition of aluminum on the face of the substrate to provide source metallization and metallization of the source and gate pads;
wherein:
definition and formation of the source regions take place using a silicon oxide mask obtained by formation of spacers of dielectric material placed against the gate wall, and wherein
metallization of the source and gate contact areas is effected with silicides of refractory metals after formation of a spacer of dielectric material along the gate walls.

Other solutions in accordance with the invention are indicated below in the claims.

BRIEF DESCRIPTION OF THE DRAWINGS

The invention will now be described with reference to a nonlimiting embodiment example with reference to the annexed drawings wherein.

DESCRIPTION OF THE PREFERRED EMBODIMENT

An example of an embodiment of the process in accordance with the present invention is explained below for the manufacture of an N-channel power-MOS. However, with the necessary modifications clear to those skilled in the art, it also applies to the case of manufacture of a P-channel power-MOS transistor.

Figure 1:
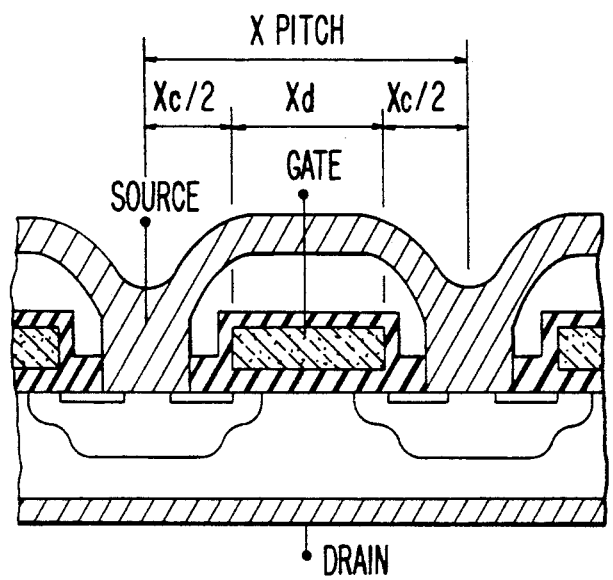
FIG. 1 shows the structure of a known power-MOS.
Figure 2:
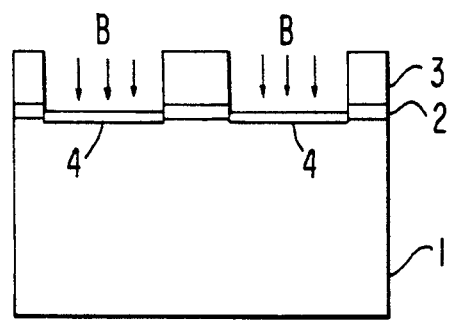
FIGS. 2-10 show the different steps of a process in accordance with the present invention.
Figure 3:
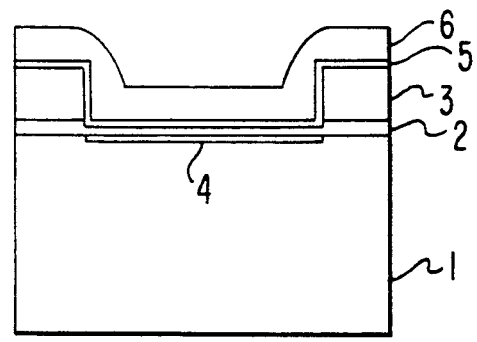
Figure 4:
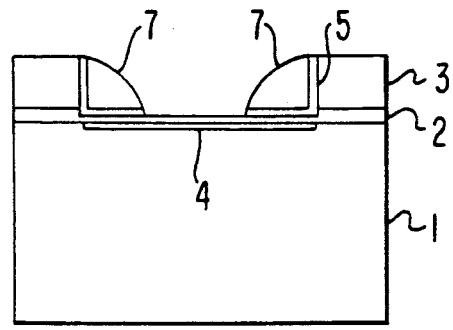
Figure 5:
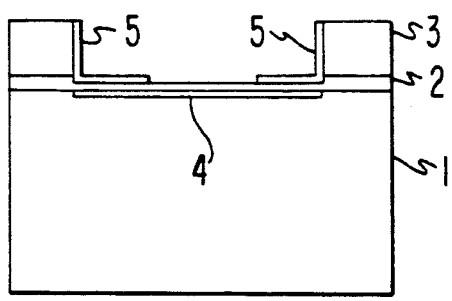
Figure 9:
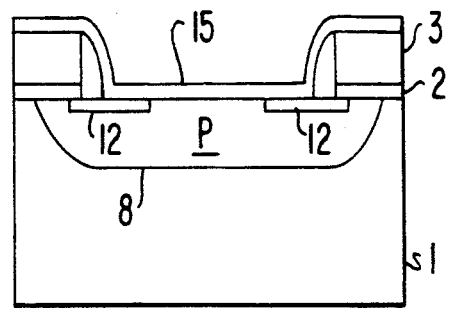
Figure 6:
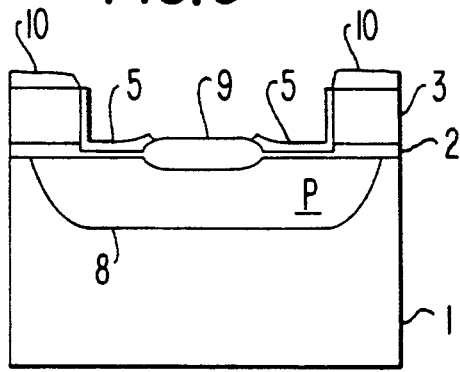
Figure 10:
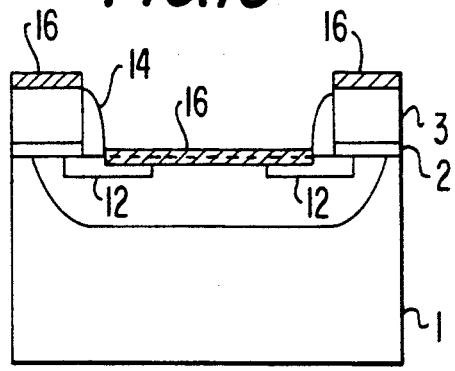
Figure 7:
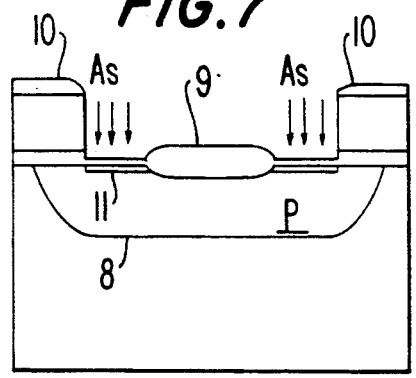
Figure 8:
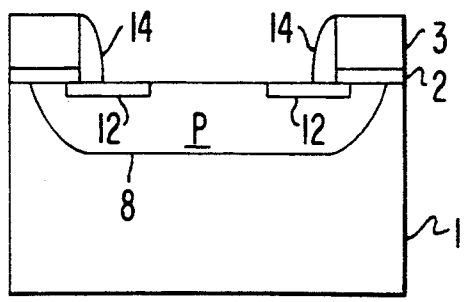

The process comprises in sequence the following steps, of which the initial ones, specifically from a. to d., are already provided for in the known art.

a. Epitaxial growth of a layer of type N silicon on a type N+ silicon substrate.

b. Growth of a layer of silicon dioxide (field oxide) on the epitaxial layer and subsequent definition of the edge of the chip by photoengraving.

c. Formation of a layer 2 of silicon dioxide (gate oxide) over the entire substrate and subsequent deposition of a layer 3 of polycrystalline silicon (poly).

d. Photoengraving of the poly for formation of the gate.

e. Implantation of the region 4 with type P dopant and in particular with boron (FIG. 2).

f. Deposition of a layer 5 of silicon nitride $Si_3N_4$ 200-400 ångstrom thick.

g. Deposition on the layer 5 of silicon nitride, by a Chemical Vapor Deposition (CVD) process, of a layer 6 of silicon dioxide $SiO_2$(vapox) having a thickness on the order of 5000 ångstrom (FIG. 3).

h. Reactive Ion Etching (RIE) of the layer 6 of vapox dioxide so as to create a spacer 7 along the gate walls (FIG. 4).

i. Etching of the silicon nitride layer 5 in the unprotected area of the spacer.

l. Stripping of the vapox dioxide constituting the spacer to uncover the underlying silicon nitride 5 (FIG. 5).

m. Diffusion of the dopant present in 4 with the resulting formation of the region 8 of the body.
n. Formation of the layers 9 and 10 of silicon dioxide on the body and on the gate poly by a selective oxidation process using planox technology (FIG. 6).
o. Stripping of the layer of $Si_3N_4$ from the area previously occupied by the spacer.
p. Implantation or predeposition of dopant, in particular arsenic, on the area 11 previously occupied by the spacer, using as a mask the layer 9 of silicon dioxide (FIG. 7).
q. Diffusion of the arsenic with resulting formation of the source regions 12 (FIG. 8).
r. Stripping of the layers 9 and 10 of dioxide previously formed on the body and on the gate poly.
s. Deposition of a vapox layer approximately 1500 ångstrom thick and subsequent RIE thereof with resulting provision of a spacer 14 along the gate walls (FIG. 8).
t. Deposition of a layer 15 of refractory metal, in particular titanium (FIG. 9).
u. Formation on the contact areas 16 of FIG. 10 of a silicide TiSi by Rapid Thermal Annealing (RTA).
v. Selective etching to eliminate the refractory metal covering said spacer 14 followed by further RTA and resulting sintering of the titanium to $TiSi_2$ (layer 16 of FIG. 10).

Indicated below are the steps, already provided in the known art, which follow: deposition of a layer of dielectric 17 approximately 11000 ångstrom thick on the face of the substrate, opening of windows in the dielectric layer for formation of the source contacts, metallization on the front (layer 18 of FIG. 11) and subsequent photoengraving, passivation and further photoengraving and finally finishing of the back face of the substrate.

Figure 11:
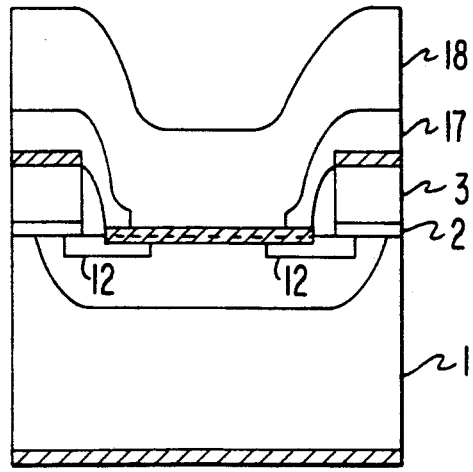
FIG. 11 shows a power-MOS device obtained by the same process.

The structure of the device obtained at the end of the process is shown schematically in FIG. 11.

Step o. of the process indicated above is optional. Indeed, implantation of dopant for formation of the source regions can take place without previous stripping of the layer of $Si_3N_4$.

For the photoengraving there is used photolithographic exposure equipment of the 5:1 stepper type which allows minimum apertures on the order of 1 μm with maximum misalignment between two successive photoengravings of 0.35 μm.

The use of these photographic exposure units together with self-alignment techniques such as those of spacers and self-aligned silicide make it possible to obtain considerable improvements without advanced photolithographic techniques.

In accordance with the present invention, the Xpitch dimension of the elementary cell is reduced to values not in excess of approximately 2-3 μm with the possibility of achieving a cell density on the order of $8 \cdot 10^7$ cells per square inch. As an indication Xc can be approximately 1.8 μm., and Xd about 1 μm. Indeed, the Xc dimension is conditioned by a single alignment and can fall to values of approximately 1.8 μm while Xd can fall to values of approximately 1 μm.

The sequence of operations is simplified with a reduction of maskings from 7 to 5.

Silicides on the source, on the body and on the gate polysilicon allow considerable reduction of the increase in parasite resistances due to the considerable reduction of the metal/semiconductor contact areas on the active regions and reduction of the increase in the resistance of the gate poly due to high integration. This also allows elimination of the risk of spikes on the aluminum of the metallization and consequently permits reduction of the body depth (not more than 0.4 μm) and the side dimensions of the body and gate.

Among other advantages the RTA process makes it possible to limit the side growth of the silicide on the spacer, which would otherwise risk short circuiting the gate with the other electrodes.

To the above advantages are to be added the following electrical advantages:
  reduction of the size of the source produces a decrease in the $R_{on}$ by a factor of 2 on the low voltage devices;
  reduction of the base-emitter resistance $R_{BE}$ of the parasite bipolar transistor improves the strength of the device with respect to the rapid voltage variations;
  reduction of the size of the source, which goes from the present 4-6 μm to approximately 0.5 μm results in an increase of the strength of the power-MOS by a factor of 10.

Although the present invention has been described for a specific embodiment it is evident that many alternatives and variations, such as in materials and dimensions, will be apparent to those skilled in the art in light of the foregoing description. Accordingly, the invention is intended to embrace all of the alternative and variants that fall within the spirit and scope of the invention. For example, one of the variants can provide in step t. of the above described process the deposition of another refractory metal such as Co, W or an alloy thereof and in the latter case the formation of the related silicides in step u.

Another variant can consist of effecting a further self-aligned ionic implantation of dopant to form a deep body P+ region between steps i. and l. described above.

We claim:
1. A process for the manufacture of power-MOS semiconductor devices comprising the following steps:
  epitaxial growth on a silicon substrate having a certain conductivity type of at least one layer of silicon of the same conductivity type;
  gate oxidation over the entire substrate;
  deposition of a layer of polycrystalline silicon on a face of the substrate;
  opening, by means photoeching, of a gate window in the layer of polycrystalline silicon for definition of the gate polysilicon;
  implantation and diffusion of a dopant into the gate window for formation of the body;
  implantation and diffusion of a dopant in the body for formation of the source regions;
  deposition of P-Vapox dielectric on the face of the substrate;
  opening of windows on the face of the substrate for formation of the source contacts, and
  deposition of aluminum on the face of the substrate to provide source metallization and metallization of source and gate pads; wherein:
  definition and formation of the source regions take place using a silicon oxide mask obtained by formation of spacers of dielectric material placed against the gate walls, and wherein
  metallization of the source and gate contact areas is effected with silicides of refractory metals after formation of a spacer of dielectric material along the gate walls; and wherein:

the opening of the above said gate window in the polycrystalline silicon layer is followed by:
ionic implantation of dopant on the surface of the substrate at said window for formation of the body;
CVD deposition of a thin layer of silicon nitride $Si_3N_4$ over the entire substrate;
CVD deposition of a layer of dielectric on the surface of the substrate;
RIE of the layer of dielectric and provision of a spacer along the walls of the above said gate window;
etching of the silicon nitride layer in the area not protected by the spacer;
stripping of the spacer so as to uncover the underlying silicon nitride;
diffusion of a dopant for formation of the body region and formation of a layer of silicon dioxide and of a layer of silicon dioxide on the gate polysilicon and the body respectively using Planox technology;
stripping of the silicon nitride layer from the area previously occupied by the spacer;
use of the layer of silicon dioxide formed on the body as a mask for implantation or predeposition of dopant and subsequent diffusion to provide the source regions;
stripping of the layers and of silicon dioxide previously formed on the body and the gate poly-silicon;
creation of a spacer of dielectric material along the gate walls;
metallization of the source and gate contact areas by deposition of a layer of refractory metal and formation by sinterization of a silicide by RTA;
selective etching for elimination of the refractory metal covering the above spacer, followed by another sinterization of the silicide by RTA;
deposition of dielectric on the face of the substrate and opening of windows for formation of the source contacts.

2. A process for the manufacture of power-MOS semiconductor devices comprising the following steps:
epitaxial growth on a silicon substrate having a certain conductivity type of at least one layer of silicon of the same conductivity type;
gate oxidation over the entire substrate;
deposition of a layer of polycrystalline silicon on a face of the substrate;
opening, by means photoetching, of a gate window in the layer of polycrystalline silicon for definition of the gate polysilicon;
implantation and diffusion of a dopant into the gate window for formation of the body;
implantation and diffusion of a dopant in the body for formation of the source regions;
deposition of P-Vapox dielectric on the face of the substrate;
opening of windows on the face of the substrate for formation of the source contacts, and
deposition of aluminum on the face of the substrate to provide source metallization and metallization of source and gate pads; wherein:
definition and formation of the source regions take place using a silicon oxide mask obtained by formation of spacers of dielectric material placed against the gate walls, and wherein
metallization of the source and gate contact areas is effected with silicides of refractory metals after formation of a spacer of dielectric material along the gate walls; and wherein:

the opening of the above gate window in the polycrystalline silicon layer is followed by:
ionic implantation of a dopant on the surface of the substrate at said window for formation of the body;
CVD deposition of a thin layer of silicon nitride $Si_3N_4$ over the entire substrate;
CVD deposition of a layer of dielectric on the surface of the substrate;
RIE of the layer of dielectric and provision of a spacer along the walls of the above said gate window;
etching of the silicon nitride layer in the area not protected by the spacer;
stripping of the spacer so as to uncover the underlying silicon nitride;
diffusion of a dopant for formation of the body region, and formation of a layer of silicon dioxide and of a layer of silicon dioxide on the gate polysilicon and on the body respectively, using Planox technology;
use of the silicon dioxide layer formed on the body as a mask for implantation of a dopant through the silicon nitride layer and subsequent diffusion for provision of the source regions;
stripping of the silicon nitride layer from the area previously occupied by the spacer;
stripping of the layers and of dioxide previously formed on the body and on the gate polysilicon;
creation of a spacer of dielectric material along the gate walls;
metallization of the source and gate contact areas by deposition of a layer of refractory metal and formation by sinterization of a silicide by RTA;
selective etching for elimination of the refractory metal covering the above spacer followed by another sinterization of the silicide by RTA;
deposition of dielectric on the face of the substrate and opening of windows for formation of the source contacts.

3. A process in accordance with claims 1 or 2 wherein the etching of the silicon nitride layer in the areas not protected by the spacer is followed by a second ionic implantation of a dopant at the window defined by the spacer for formation of a deep body region and is further followed by stripping of the spacer and by the subsequent diffusion of a dopant for formation of the body and deep body regions.

4. A process in accordance with claims 1 or 2 wherein:
the silicon nitride layer has a thickness of between 200 and 400 angstroms;
the dielectric layer consists of silicon dioxide $SiO_2$ and has a thickness on the order of 5000 angstroms;
creation of the spacer is provided by deposition of a layer of silicon dioxide $SiO_2$ having a thickness on the order of 1500 angstroms.

5. A process in accordance with claims 1 or 2 wherein the photoetching processes take place using photographic exposure equipment of the 5:1 stepper type.

6. A process in accordance with claims 1 or 2 wherein for metallization of the body, source and gate contact areas there are used silicides of titanium or cobalt or tungsten or their alloys.

7. A process for the manufacture of power-MOS semiconductor devices comprising the following steps:
epitaxial growth on a silicon substrate having a certain conductivity type of at least one layer of silicon of the same conductivity type;

gate oxidation over the entire substrate;

deposition of a layer of polycrystalline silicon on a face of the substrate;

opening, by means photoetching, of a gate window in the layer of polycrystalline silicon for definition of the gate polysilicon;

implantation and diffusion of a dopant into the body for formation of the source regions;

deposition of P-Vapox dielectric on the face of the substrate;

opening of windows on the face of the substrate for formation of the source contacts, and deposition of aluminum on the face of the substrate to provide source metallization and metallization of source and gate pads; wherein:

definition and formation of the source regions take place using a silicon oxide mask obtained by formation of spacers of dielectric material placed against the gate walls, and by a layer of silicon nitride underlying said spacers, said mask being realized on the area not covered by said silicon nitride layer;

and wherein the opening of the above said gate window in the polycrystalline silicon layer is followed by:

ionic implantation of dopant on the surface of the substrate at said window for formation of the body;

CVD deposition of a thin layer of silicon nitride $Si_3N_4$ over the entire substrate;

CVD deposition of a layer of dielectric on the surface of the substrate;

RIE of the layer of dielectric and provision of a spacer along the walls of the above said gate window;

etching of the silicon nitride layer in the area not protected by the spacer;

stripping of the spacer so as to uncover the underlying silicon nitride;

diffusion of a dopant for formation of the body region and formation of a layer of silicon dioxide and of a layer of silicon dioxide on the gate polysilicon and the body respectively using Planox technology;

stripping of the silicon nitride layer from the area previously occupied by the spacer;

use of the layer of silicon dioxide formed on the body as a mask for implantation or predeposition of dopant and subsequent diffusion to provide the source regions;

stripping of the layers of silicon dioxide previously formed on the body and on the gate polysilicon;

creation of a spacer of dielectric material along the gate walls;

metallization of the source and gate contact areas by deposition of a layer of refractory metal and formation by sinterization of a silicide by RTA;

selective etching for elimination of the refractory metal covering the above spacer, followed by another sinterization of the silicide by RTA;

deposition of dielectric on the front of the substrate and opening of windows for formation of the source contacts.

8. A process for the manufacture of power-MOS semiconductor devices comprising the following steps:

epitaxial growth on a silicon substrate having a certain conductivity type of at least one layer of silicon of the same conductivity type;

gate oxidation over the entire substrate;

deposition of a layer of polycrystalline silicon on a face of the substrate;

opening, by means photoetching, of a gate window in the layer of polycrystalline silicon for definition of the gate polysilicon;

implantation and diffusion of a dopant into the body for formation of the source regions;

deposition of P-Vapox dielectric on the face of the substrate;

opening of windows on the face of the substrate for formation of the source contacts, and deposition of aluminum on the face of the substrate to provide source metallization and metallization of source and gate pads; wherein:

definition and formation of the source regions take place using a silicon oxide mask obtained by formation of spacers of dielectric material placed against the gate walls, and by a layer of silicon nitride underlying said spacers, said mask being realized on the area not covered by said silicon nitride layer;

and wherein the opening of the above gate window in the polycrystalline silicon layer is followed by:

ionic implantation of a dopant on the surface of the substrate at said window for formation of the body;

CVD deposition of a thin layer of silicon nitride $Si_3N_4$ over the entire substrate;

CVD deposition of a layer of dielectric on the surface of the substrate;

RIE of the layer of dielectric and provision of a spacer along the walls of the above said gate window;

etching of the silicon nitride layer in the area not protected by the spacer;

stripping of the spacer so as to uncover the underlying silicon nitride;

diffusion of a dopant for formation of the body region, and formation of a layer of silicon dioxide and of a layer of silicon dioxide on the gate polysilicon and on the body respectively, using Planox technology;

use of the silicon dioxide layer formed on the body as a mask for implantation of a dopant through the silicon nitride layer and subsequent diffusion for provision of the source regions;

stripping of the silicon nitride layer from the area previously occupied by the spacer;

stripping of the layers of dioxide previously formed on the body and on the gate polysilicon;

creation of a spacer of dielectric material along the gate walls;

metallization of the source and gate contact areas by deposition of a layer of refractory metal and formation by sinterization of a silicide by RTA;

selective etching for elimination of the refractory metal covering the above spacer followed by another sinterization of the silicide by RTA;

deposition of dielectric on the face of the substrate and opening of windows for formation of the source contacts.

9. A process in accordance with claims 7 or 8, wherein the etching of the silicon nitride layer in the areas not protected by the spacers is followed by a second ionic implantation of a dopant at the window defined by the spacers for formation of a deep body region and is further followed by stripping of the spacer and by the subsequent diffusion of a dopant for formation of the body and deep body regions.

10. A process in accordance with claims 7 or 8, wherein:

the silicon nitride layer has a thickness of between 200 and 400 angstroms;

the dielectric layer consists of silicon dioxide SiO$_2$ and has a thickness on the order of 5000 angstroms;

creation of the spacers is provided by deposition of a layer of silicon dioxide SiO$_2$ having a thickness on the order of 1500 angstroms.

* * * * *